United States Patent [19]
Napoli et al.
[11] 3,731,180
[45] May 1, 1973

[54] FREQUENCY TRANSLATOR CIRCUIT

[75] Inventors: Louis Sebastian Napoli, Hamilton; John Joseph Hughes, Spotswood, both of N.J.
[73] Assignee: RCA Corporation, New York, N.Y.

[22] Filed: Mar. 13, 1972
[21] Appl. No.: 234,179

[52] U.S. Cl.............321/69 NL, 307/320, 321/69 W, 330/4.9
[51] Int. Cl.............................H02m 5/30, H01p 3/08
[58] Field of Search........................321/69 NL, 69 W; 330/4.9; 307/88.3, 320; 331/117 V

[56] References Cited

UNITED STATES PATENTS

| | | | |
|---|---|---|---|
| 3,162,824 | 12/1964 | Herzog | 330/4.9 X |
| 3,662,294 | 5/1972 | Jacobs et al. | 321/69 W X |
| 3,111,629 | 11/1963 | Harris | 330/4.9 |
| 3,296,519 | 1/1967 | Kaufmann et al. | 321/69 NL |

*Primary Examiner*—Gerald Goldberg
*Attorney*—Edward J. Norton

[57] ABSTRACT

The reactance of an active element exhibiting a non-linear current-voltage characteristic in response to an applied input signal and generating an output signal at a desired frequency is incorporated as part of a circuit resonant at both the frequency of the applied input signal and of the output signal.

8 Claims, 5 Drawing Figures

FREQUENCY TRANSLATOR CIRCUIT

DESCRIPTION OF THE PRIOR ART

Varactor diodes have been used as a harmonic frequency generating element in circuits designed to the operating frequency of an input microwave signal. Usually, the varactor is coupled to the frequency multiplying circuit between an input section resonant at an input frequency and an output section resonant at a desired harmonic of the input frequency. The input and output sections are usually in the form of filters designed to transmit microwave energy at only a desired frequency. The frequency multiplying circuit must also transform the complex impedance of the varactor to a different input or output load impedance. The complexity of the input and output multiplier sections decrease the operating efficiency of the frequency multiplying circuit. The decrease in operating efficiency is especially critical when the power level of the input microwave signal is relatively low. A circuit which incorporates the reactance of the varactor as part of a resonant condition at both the input and desired output frequencies is a solution to this problem.

SUMMARY OF THE INVENTION

A frequency translator circuit having the terminals of an active element connected to a predetermined length of transmission line at a critical location allows the transmission of an output signal at a desired frequency related to the frequency of an input signal. The active element exhibits a nonlinear current-voltage characteristic in response to an input signal applied between its terminals. The predetermined length of transmission line and active element are resonant at both the input and desired output frequencies. The connection of the active element terminals to the transmission line at a critical location provides a current path through the active element at both the input and output frequencies.

Further features and advantages of the invention will become more readily apparent from the following description of specific embodiments, as shown in the accompanying drawings in which:

DESCRIPTION OF THE PREFERRED EMBODIMENT

A microwave circuit comprising a resonant input section, a varactor diode and a resonant output section is used to multiply the frequency of an input microwave signal coupled to the resonant input section. A varactor diode exhibits a nonlinear impedance variation in response to an input microwave signal. This characteristic of the varactor causes it to generate energy at frequencies harmonically related to that of the input microwave signal. Energy at a desired harmonic frequency is coupled from the microwave circuit's output section which is resonant at the desired harmonic frequency. It is desirable that the frequency multiplier circuit be designed to provide a current path through the diode at both the input and desired harmonic output frequencies. The input section of the multiplier is designed to transmit only energy at the input frequency and to prevent the transmission of energy at harmonically related frequencies. The output section of the multiplier is designed to transmit only energy at the desired harmonic frequency and to prevent the transmission of all other frequencies. The input and output multiplier sections are also designed to provide an impedance transformation from the complex impedance of the diode to a terminating load impedance. The design of the frequency multiplier is simplified if the varactor impedance is included as part of a circuit resonant at both the input and desired harmonic frequencies, therefore, eliminating the need for separate resonant input and output sections.

Figure 1:
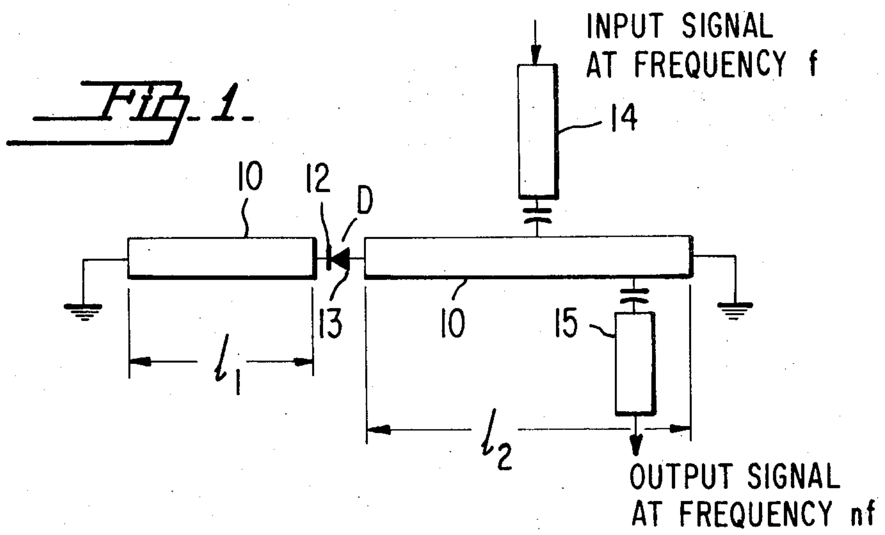
FIG. 1 is a schematic representation of a TEM mode transmission line varactor multiplier having a center conductor grounded at both ends.
Figure 4:
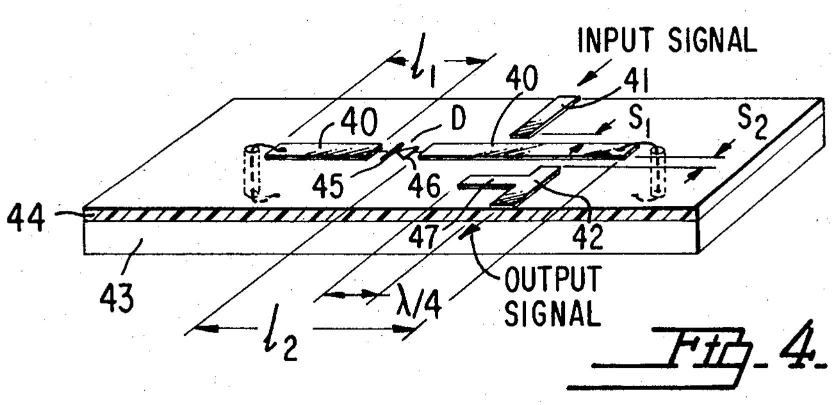
FIG. 4 is an isometric drawing of a microstrip frequency doubler.

Referring to FIG. 1, there is shown a schematic of a TEM mode transmission line varactor multiplier. A TEM mode transmission line comprises a center conductor separated from a ground conductor by a dielectric media. The electromagnetic fields of a TEM mode transmission line are confined between the center conductor and ground conductor. For the sake of clarity in the drawing, a ground conductor is not shown in the schematic. A ground conductor would be provided in the embodiment of FIG. 1 as taught in the present state of the art, as illustrated in FIG. 4 of the drawing by way of example only. The ends of center conductor 10 are connected to the ground conductor. The center conductor of a transmission line having an end connected to ground potential and an open circuited end, can be represented as an inductive reactance in the equation:

$$jZ_o \tan (2\pi/\lambda)\, l \qquad (1)$$

where $Z_o$ is the characteristic impedance of the transmission line, $\lambda$ is the wavelength at the desired operating frequency and $l$ is a center conductor length less than $\lambda/4$. The electrodes 12 and 13 of varactor diode, D, are serially connected to the center conductor 10 at a critical predetermined location. The varactor impedance at relatively low input microwave power levels is substantially equivalent to a capacitive reactance. A resonant condition exists for center conductor 10 and varactor D when $$Z_o \tan (2\pi/\lambda)\, l_1 + Z_o \tan (2\pi/\lambda)\, l_2 - 1/2\pi fC = 0 \qquad (2)$$

where $Z_o$ is the characteristic impedance of the transmission line formed by center conductor 10 and the ground conductor, $\lambda$ is the wavelength at the desired frequency of resonance, $f$, C is the capacitance of varactor, D, under desired operating conditions, and the lengths $l_1$ and $l_2$ locate the connections of the varactor electrodes 12 and 13 along the center conductor 10.

A resonant condition exists if the total length of center conductor 10, $(l_1 + l_2)$, is substantially equal to an electrical length of either $\lambda/4$ or $\lambda/2$, where $\lambda$ is the wavelength at the frequency, $f_1$, of the input signal. At resonance, the capacitive reactance of the varactor, D, is matched by the conjugate reactance of the center conductor 10. Therefore, it is desirable to design the center conductor 10 and varactor, D, to be resonant at both the input frequency and the desired output harmonic frequency. These conditions require a solution to the simultaneous equations:

$$Z_o \tan(2\pi/\lambda)\, l_1 + Z_o \tan(2\pi/\lambda)\, l_2 - 1/2\pi f_1 C = 0 \quad (3)$$

$$Z_o \tan n(2\pi l_1)/\lambda + Z_o \tan n(2\pi l_2)/\lambda - 1/n(2\pi f_1 C) = 0$$

where $Z_o$ is the characteristic impedance of the transmission line formed by center conductor 10 and the ground conductor, $\lambda$ is the wavelength at the input frequency $f_1$, C is the capacitance of varactor, D, under desired operating conditions, the lengths $l_1$ and $l_2$ locate the electrode connections of varactor D along center conductor 10, and $n$ is the desired harmonic number. The characteristic impedance of the transmission line section with a center conductor 10 length $l_1$ can be designed to be different from the characteristic impedance of the transmission line section with a center conductor 10 length $l_2$. This design would provide a desired reactive termination at a particular harmonic or subharmonic frequency generated by varactor D.

An end of the center conductor 14 of an input TEM mode transmission line is capacitively coupled to the center conductor 10 of the resonant transmission line. The magnitude of capacitive coupling aids the impedance transformation from an input impedance to the impedance of the resonant transmission line and varactor D. The capacitive coupling between center conductor 14 and center conductor 10 occurs at a location along center conductor 10 that is optimum for energy transmission to varactor D at the input frequency. The same location is not optimum for energy transmission along center conductor 14 at frequencies harmonically related to the input frequency. An end of the center conductor 15 of an output TEM mode transmission line is capacitively coupled to the center conductor 10 of the resonant transmission line. The magnitude of the capacitive coupling aids the impedance transformation from an output impedance to the impedance of the resonant transmission line and varactor D. The capacitive coupling between center conductor 15 and center conductor 10 occurs at a location along center conductor 10 that is optimum for the transfer of energy at the desired harmonic frequency.

Figure 2:
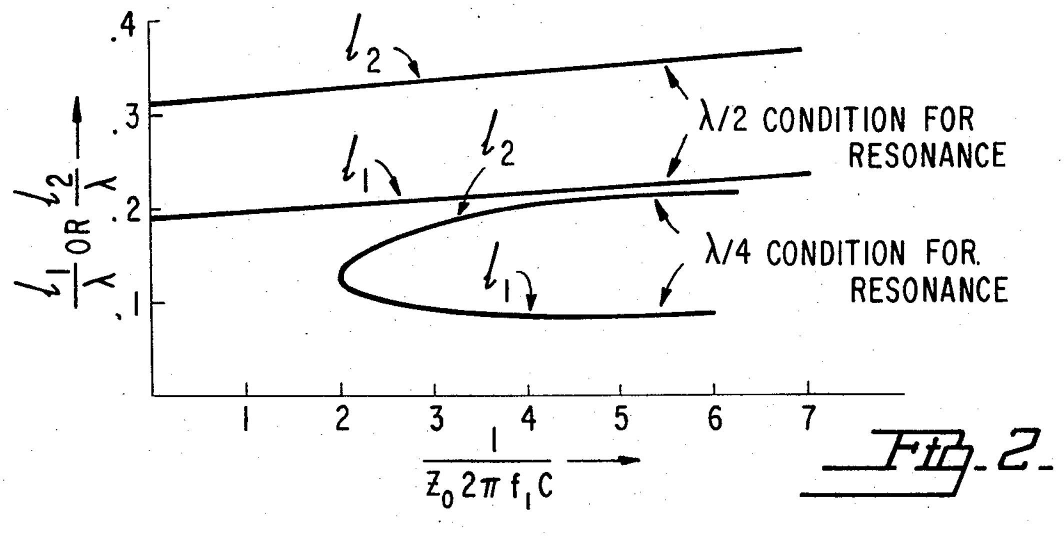
FIG. 2 is a graph of $l_1/\lambda$ or $l_2/\lambda$ vs. $1/Z_o 2\pi f_1 C$ for both the $\lambda/2$ and $\lambda/4$ condition for resonance.

The design procedure for a frequency doubler having a circuit schematically represented in FIG. 1 is used as an illustration of a simplified frequency multiplier. Referring to FIG. 2, there is shown a graphical solution for the unknown center conductor 10 lengths, $l_1$ and $l_2$, defined by the simultaneous Equations (3). FIG. 2 is a graph of the lengths $l_1/\lambda$ and $l_2/\lambda$ vs. $1/Z_o 2\pi f_1 C$ for both the $\lambda/2$ and $\lambda/4$ condition for resonance. The varactor capacitance, C, the input frequency $f_1$, and the characteristic impedance $Z_o$, as defined in the simultaneous equations (3), are known or measured parameters. Therefore, the unknown center conductor 10 lengths, $l_1$ and $l_2$, can be determined from FIG. 2 for either the $\lambda/2$ or $\lambda/4$ condition for resonance.

Figure 3:
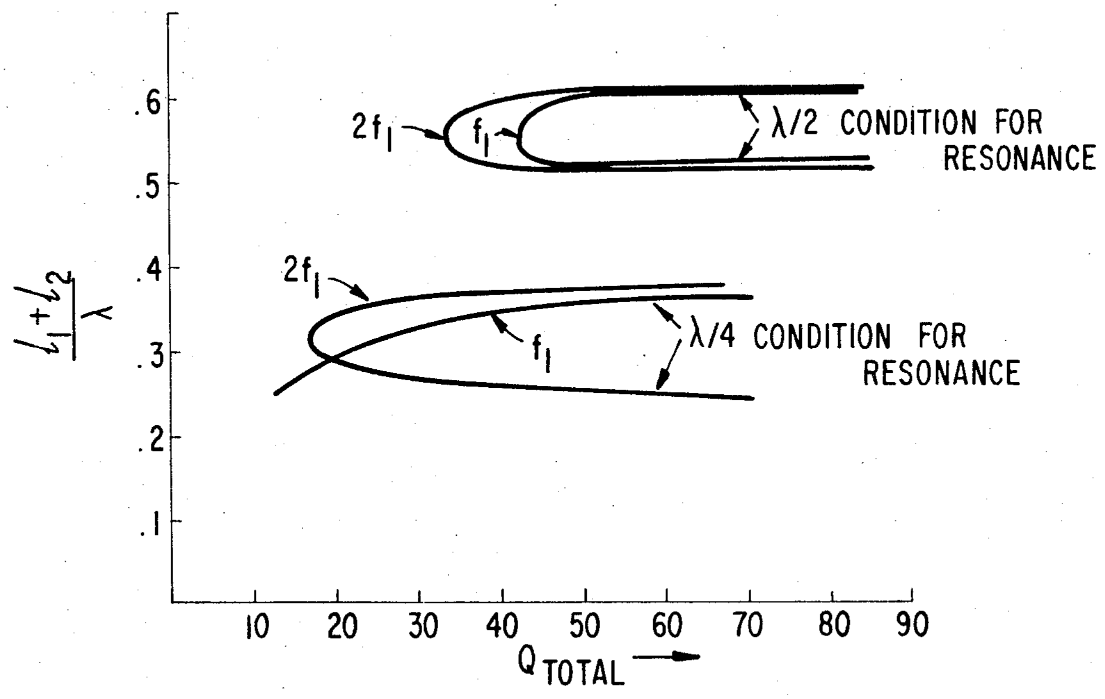
FIG. 3 is a graph of $(l_1 + l_2)/\lambda$ vs. $Q_{total}$ for both the $\lambda/2$ and $\lambda/4$ condition for resonance at the input frequency, $f_1$, and the desired second harmonic frequency $2f_1$.

It is necessary that the multiplier circuit provide a current path through varactor D at both the input frequency and the desired harmonic output frequency. FIG. 3 is a graph of $l_1 + l_2/\lambda$ versus $Q_{total}$ for both the $\lambda/2$ and $\lambda/4$ condition for resonance, for a frequency doubler where $l_1 + l_2$ is the sum of the center conductor 10 lengths locating the electrode connections of varactor D, $\lambda$ is the wavelength at the input frequency $f_1$, and $Q_{total}$ is defined by the equation:

$$Q_{\text{total}} = \frac{2\pi f \text{ (Energy stored in both the varactor and resonant transmission line)}}{\text{(Power dissipated by both the varactor and resonant transmission line)}} \quad (4)$$

where $f$ is the frequency of interest. The center conductor 10 lengths $l_1$ and $l_2$ are determined from FIG. 2. FIG. 3 is used to predict $Q_{total}$ at the input frequency $f_1$ and the second harmonic frequency $2f_1$ for the varactor D and resonant transmission line. The multiplier circuit provides the required current path through the varactor, D, at the input frequency $f_1$ and the second harmonic frequency $2f_1$ when the relative magnitude of $Q_{total}$ determined from FIG. 3 is small at these frequencies. Therefore, the use of FIGS. 2 and 3 is needed to insure a proper varactor location along the center conductor 10 for optimum performance of the multiplier circuit.

Referring to FIG. 4, there is shown an isometric drawing of a frequency doubler constructed according to principles of the disclosed invention. Microstrip transmission line is used for the construction of this circuit. The conductive center conductors 40, 41, 42 and 47 are separated from the conductive ground plane 43 by a 0.020 inch thick dielectric substrate 44 having a dielectric constant of 2.3, for example. The width of the center conductors 40, 41 and 42 is designed to provide transmission lines having a characteristic impedance, $Z_o$, of 50 ohms. Each end of the center conductor 40 is connected to the ground plane 43. The electrodes 45 and 46 of a Schottky barrier on silicon varactor, D, are connected to the center conductor 40. The capacitance of the varactor at zero volts DC bias is 0.15 pico farads. The cutoff frequency, $f_c$, of the varactor diode at zero volts DC bias is 900 GHz. The length $l_1$ from a short circuited end of the center conductor 40 to the cathode electrode 45 of varactor D is 0.197 inches. The length $l_2$ from the other short circuited end of the center conductor 40 to the anode electrode 46 of varactor D is 0.323 inches. A −20dbm input signal centered at 8.70 GHz is transmitted along the input center conductor 41 and is capacitively coupled to center conductor 40 at an optimum high microwave voltage point at the input frequency. A relatively high microwave voltage point is established along the center conductor 40 at $\lambda_1/4$ from a ground connection point, where $\lambda_1$ is the wavelength at the input frequency. The input center conductor 41 is also located at a voltage minimum at the second harmonic of the input frequency which prevents the efficient transmission of energy at this frequency along input center conductor 41. A −34dbm output signal center at 17.4 GHz is transmitted along the output center conductor 42 which is capacitively coupled to the resonant center conductor 40 at a relatively high microwave voltage point at the output frequency. A relatively high microwave voltage point is established along the resonant center conductor 40 at $\lambda_2/4$ from a ground connection point, where $\lambda_2$ is the wavelength at the second harmonic of the input frequency. Transmission of energy at the input frequency along the output center conductor 42 is prevented by the filtering characteristics of the open circuited stub 47 having an electrical length of $\lambda_1/4$, where $\lambda_1$ is the wavelength at the input frequency. The magnitude of the capacitive coupling gaps, $S_1$ and $S_2$, can be determined from the 1969 issue of the "-Microwave Journal Engineers' Technical And Buyers Guide" page 72.

The multiplier design technique is not limited to a varactor diode as the harmonic generating element. The circuit design illustrated schematically in FIG. 1 may be used for any device capable of generating energy at harmonic frequencies or a device requiring a resonant circuit at specific frequencies. The reactance of the device would be substituted in the simultaneous Equations (2) for the capacitive reactance of the varactor. Equations for the specific frequencies at which resonance is desired would be substituted for the equation containing the harmonic frequency $nf_1$, in Equations (2). The resulting simultaneous equations would be solved for those unknown parameters necessary for resonance at the desired frequencies.

Figure 5:
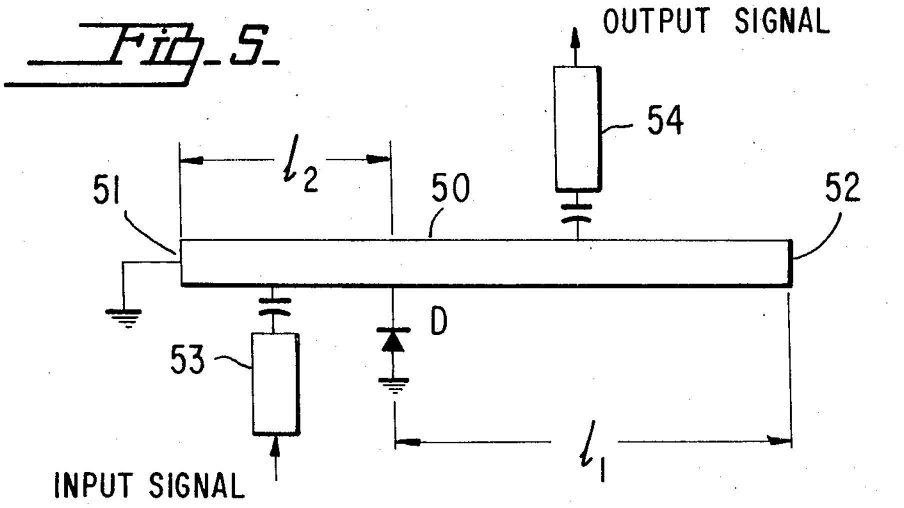
FIG. 5 is a schematic representation of a TEM mode transmission line varactor multiplier having a center conductor grounded at one end and open circuited at the other end.

Referring to FIG. 5, there is shown a schematic of a frequency multiplier having the center conductor 50 of a TEM mode transmission line grounded at one end 51 and open circuited at the other end 52. As in FIG. 1, a varactor diode, D, is used as the harmonic generating element. The center conductor of a transmission line having both ends open circuited can be represented as a capacitive susceptance in the equation $$jY_o \tan(2\pi/\lambda)\, l \qquad (5)$$

where $Y_o$ is the characteristic admittance of the transmission line, $\lambda$ is the wavelength at the desired operating frequency, and $l$ is the center conductor length.

The electrodes of the varactor, D, are connected between the center conductor 50 and ground. The simultaneous equations for a resonant condition are:

$$Y_o \tan(2\pi/\lambda)\, l_1 - Y_o \cot(2\pi/\lambda)\, l_2 + 2\pi fC = 0 \qquad (6)$$

$$Y_o \tan n(2\pi l_1)/\lambda - Y_o \cot n(2\pi l_2)/\lambda + n(2\pi fC) = 0$$

where $Y_o$ is the characteristic admittance of the center conductor 50, $\lambda$ is the wavelength at the input frequency $f$, $l_1$ and $l_2$ are the unknown lengths of center conductor 50 locating the connection of varactor D to the center conductor 50, C is the magnitude of the varactor capacitance under desired operation conditions and $n$ is the desired harmonic number. If the magnitude of the input power level changes the magnitude of varactor capacitance or a source of external DC bias is coupled across the varactor electrodes, then the varactor capacitance magnitude under these operating conditions is substituted into the Equations (3) and (6). The input center conductor 53 is capacitively coupled to the resonant center conductor 50 and varactor D at a relatively high microwave voltage point at the input frequency. The input center conductor 53 is located $\lambda/4$ from the short circuited end 51 of the resonant center conductor 50, where $\lambda$ is the wavelength at the input frequency $f$. The output center conductor 54 is also capacitively coupled to the resonant center conductor and varactor D at a relatively high microwave voltage point but at the desired output harmonic frequency. The output center conductor 54 is simultaneously located at a voltage minimum at the input frequency. This prevents efficient coupling of energy at this frequency. The output center conductor 54 is capacitively coupled to the resonant center conductor at $\lambda/2$ from the open circuited end 52 of the resonant center conductor 50, where $\lambda$ is the wavelength at the desired output harmonic frequency.

Transmission lines other than a TEM mode transmission line may be used in the frequency multiplier design. For example, if a waveguide transmission line section short circuited at both ends were used in the frequency multiplier circuit of FIG. 1 and the varactor diode was internally shunt connected across the broad dimensioned waveguide walls, in a position optimum for effective impedance transformation from the waveguide impedance to the diode impedance, the necessary simultaneous equations would be $$-\left(\cot \frac{2\pi}{\lambda_{g_1}} l_1\right)\frac{1}{Z_{0_1}} + 2\pi f_1 C - \left(\cot \frac{2\pi}{\lambda_{g_1}} l_2\right)\frac{1}{Z_{0_1}} = 0 \qquad (7)$$

$$-\left(\cot \frac{2\pi n}{\lambda_{g_2}} l_1\right)\frac{1}{Z_{0_2}} + n(2\pi f_1 C) - \left(\cot \frac{2\pi n}{\lambda_{g_2}} l_2\right)\frac{1}{Z_{0_2}} = 0$$

where $\lambda_{g\,1}$ is the guide wavelength at the input frequency $f_1$, $Z_o$, is the waveguide characteristic impedance at the input frequency $f_1$, $l_1$ and $l_2$ are the waveguide lengths from the short circuited ends to the varactor electrodes, C is the varactor capacitance under multiplier operating conditions, $\lambda_{g\,2}$ is the guide wavelength at the desired multiplier output frequency $nf_1$, $Z_{o\,2}$ is the waveguide characteristic impedance at the desired multiplier output frequency $nf_1$, n is the desired harmonic number.

The application of the disclosed frequency multiplier has been illustrated by a varactor frequency doubler. Numerous and varied other arrangements can readily be devised in accordance with the disclosed principles.

What is claimed is:

1. A frequency translator circuit for providing an output signal at a desired frequency related to the frequency of an input signal comprising:

a predetermined length of transmission line having first and second sections each having one end connected to a point of reference potential, an active element having at least first and second terminals and exhibiting a nonlinear current-voltage characteristic resulting in a variable impedance in response to said input signal coupled to said transmission line, said first terminal being connected to the other end of said first transmission line section and said second terminal being connected to the other end of said second transmission line section to provide a current path through said element at said input frequency and said desired output frequency, said transmission line and said impedance of said active element connected thereto forming a one half wavelength resonator at said input frequency, means for coupling said input signal to said transmission line and active element, means for coupling said output signal from said transmission line and active element.

2. A frequency multiplier circuit for transmitting an output signal at a desired frequency harmonically related to the frequency of an input signal, comprising:

a predetermined length of transmission line having at least one end connected to a point of reference potential, a varactor diode having at least two terminals and having a capacitance magnitude responsive to a bias signal including said input signal, said diode being connected to said transmission line between said point of reference potential end of said line and the other end of said line at a critical location providing a current path through said diode at said input frequency and said desired output frequency, said transmission line and said capacitance of said diode connected thereto forming a one half wavelength resonator at said input frequency, means for coupling said input signal to said transmission line and diode, means for coupling said output signal from said transmission line and diode.

3. A frequency multiplier circuit in accordance with claim 1 wherein said active element is a varactor diode having first and second terminals and having a capacitance magnitude responsive to a bias signal including said input signal coupled to said transmission line, said transmission line being formed of a dielectric media separating a ground conductor from first and second center conductor sections, said diode terminals being serially connected between said first and second center conductor sections, said first center conductor section length being from a ground conductor connected end to said first diode terminal, said second center conductor section length being from a ground conductor connected end to said second diode terminal, whereby said transmission line sections and said diode capacitance resonate at said input and desired output frequencies and provide a current path through said diode at said input and desired output frequencies.

4. A frequency multiplier circuit in accordance with claim 3, in which said first and second center conductor section lengths is determined from the simultaneous equations:

$$Z_{o_1} \tan \frac{2\pi}{\lambda} l_1 + Z_{o_2} \tan \frac{2\pi}{\lambda} l_2 - \frac{1}{2\pi f_1 C} = 0$$

$$Z_{o_1} \tan n \frac{(2\pi)}{\lambda} l_1 + Z_{o_2} \tan n \frac{(2\pi)}{\lambda} l_2 - \frac{1}{n(2\pi f_1 C)} = 0$$

where $Z_{o1}$ is the characteristic impedance of said first center conductor section having a length $l_1$ from said ground connected end to said first diode terminal, $Z_{o_2}$ is the characteristic impedance of said second center conductor section having a length $l_2$ from said ground connected end to said second diode terminal, $\lambda$ is the wavelength at said input frequency $f_1$, C is the diode capacitance responsive to said input signal, and n is the harmonic number determining said desired output frequency.

5. A frequency multiplier circuit in accordance with claim 2, in which said transmission line comprises a dielectric media separating a ground conductor from a center conductor, said first diode terminal being connected to said ground conductor and said second diode terminal being connected between first and second center conductor sections, said first center conductor section length being from said one end to said second diode terminal, said second center conductor section length being from said other transmission line end to said second diode terminal, whereby said transmission line sections and said diode capacitance resonate at said input and desired output frequencies and provide a current path through said diode at said input and desired output frequencies.

6. A frequency multiplier circuit in accordance with claim 5, in which said first and second center conductor section lengths is determined from the simultaneous equations:

$$Y_{o_1} \tan \frac{2\pi}{\lambda} l_1 - Y_{o_2} \cot \frac{2\pi}{\lambda} l_2 + \frac{1}{2\pi f_1 C} = 0$$

$$Y_{o_1} \tan n \frac{(2\pi)}{\lambda} l_1 - Y_{o_2} \cot n \frac{(2\pi)}{\lambda} l_2 + \frac{1}{n(2\pi f_1 C)} = 0$$

where $Y_{o\,1}$ is the characteristic admittance of said second center conductor section having a length $l_1$ from said other transmission line end to said second diode terminal, $Y_{o\,2}$ is the characteristic admittance of said first center conductor section having a length $l_2$ from said ground connected end to said second diode terminal, $\lambda$ is the wavelength at said input frequency $f_1$, C is the diode capacitance responsive to said input signal, and n is the harmonic number determining said desired output frequency.

7. A frequency multiplier circuit in accordance with claim 2, in which said input signal coupling means include capacitively coupling an input transmission line to said predetermined length of transmission line at a relatively high microwave voltage point occurring at said input frequency.

8. A frequency multiplier circuit in accordance with claim 2, in which said output signal coupling means include capacitively coupling an output transmission line to said predetermined length of transmission line at a relatively high microwave voltage point occurring at said output frequency.

* * * * *

UNITED STATES PATENT OFFICE
CERTIFICATE OF CORRECTION

PATENT NO. : 3,731,180

DATED : May 1, 1973

INVENTOR(S) : L. S. Napoli and J. J. Hughes

It is certified that error appears in the above-identified patent and that said Letters Patent are hereby corrected as shown below:

Column 8, line 25 " $\frac{1}{2\pi f_1 C}$ " should be --$2\pi f_1 C$--;

Column 8, line 28 " $\frac{1}{n(2\pi f_1 C)}$ " should be --$n(2\pi f_1 C)$--.

Signed and Sealed this

*second* Day of *March 1976*

[SEAL]

*Attest:*

RUTH C. MASON
*Attesting Officer*

C. MARSHALL DANN
*Commissioner of Patents and Trademarks*